United States Patent
Schinzel-Kolb et al.

(10) Patent No.: US 7,926,976 B2
(45) Date of Patent: Apr. 19, 2011

(54) DEFORMABLE ILLUMINATION MODULE

(75) Inventors: Stephan Schinzel-Kolb, Herzogenaurach (DE); Harald Stoyan, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/587,271

(22) PCT Filed: Jan. 31, 2005

(86) PCT No.: PCT/DE2005/000143
§ 371 (c)(1),
(2), (4) Date: May 7, 2007

(87) PCT Pub. No.: WO2005/073618
PCT Pub. Date: Aug. 11, 2005

(65) Prior Publication Data
US 2008/0025022 A1    Jan. 31, 2008

(30) Foreign Application Priority Data

Jan. 30, 2004 (DE) .......................... 10 2004 004 777

(51) Int. Cl.
*F21V 21/00* (2006.01)
(52) U.S. Cl. ......... 362/249.02; 362/249.01; 362/249.11; 362/235; 362/311.02; 362/800
(58) Field of Classification Search .................. 362/800, 362/249.02, 249.01, 249.11, 235, 555, 558, 362/581, 231; 361/772, 783
See application file for complete search history.

(56) References Cited

U.S. PATENT DOCUMENTS

| 4,654,766 | A | 3/1987 | Tung |
| 5,128,842 | A * | 7/1992 | Kenmochi ....................... 362/95 |
| 6,017,241 | A | 1/2000 | Komai |
| 6,027,952 | A | 2/2000 | Liu |
| 6,371,629 | B1 | 4/2002 | Martinez |
| 6,505,956 | B1 * | 1/2003 | Priddy et al. ................... 362/249 |
| 6,566,824 | B2 | 5/2003 | Panagotacos et al. |
| 6,837,598 | B2 | 1/2005 | Marcus |
| 6,932,495 | B2 * | 8/2005 | Sloan et al. ..................... 362/294 |
| 7,036,962 | B2 * | 5/2006 | Chan ............................. 362/407 |
| 7,165,863 | B1 * | 1/2007 | Thomas et al. ................ 362/219 |
| 7,273,300 | B2 * | 9/2007 | Mrakovich ............... 362/249.01 |
| 2003/0063463 | A1 | 4/2003 | Sloan et al. |
| 2003/0071581 | A1 | 4/2003 | Panagotacos et al. |

(Continued)

FOREIGN PATENT DOCUMENTS

CN    2544374    4/2002

(Continued)

OTHER PUBLICATIONS

Office Action in Chinese Patent Application No. 200580003390.7, dated Jul. 24, 2009.

(Continued)

*Primary Examiner* — Anabel M Ton
(74) *Attorney, Agent, or Firm* — Fish & Richardson P.C.

(57) ABSTRACT

Deformable illumination module with a plurality of circuit boards that have at least one optical emitter arranged thereon and that are connected into forming a chain by way of two electrical power supply wires. The electrical power supply wires run without interruption across all circuit boards of the chain creating a parallel connection of the circuit boards.

18 Claims, 1 Drawing Sheet

U.S. PATENT DOCUMENTS

| | | | |
|---|---|---|---|
| 2003/0112627 A1 | 6/2003 | Deese | |
| 2003/0218878 A1* | 11/2003 | Swaris et al. | 362/234 |
| 2003/0223235 A1* | 12/2003 | Mohacsi et al. | 362/240 |

FOREIGN PATENT DOCUMENTS

| | | |
|---|---|---|
| DE | 91 12 826.9 | 3/1992 |
| DE | 100 52 380 | 10/2001 |
| DE | 203 13 195 | 12/2003 |
| DE | 102 97 286 | 10/2004 |
| EP | 0 980 788 | 2/2000 |
| EP | 1 233 232 | 8/2002 |
| EP | 1 341 142 | 9/2003 |
| GB | 2 363 239 | 12/2001 |
| GB | 2363239 | 12/2001 |
| TW | 118869 | 9/1989 |
| TW | 470136 | 12/2001 |
| WO | WO 03/034792 | 4/2003 |
| WO | WO 03/040612 | 5/2003 |

OTHER PUBLICATIONS

Concise Electrician Handbook (1987), pp. 446-447, with English Abstract.

Examination Report for European Patent Application No. 05 726 280.0-1268, dated May 3, 2007.

The English Translation of Pre-Notification of Reasons for the Possible Rejection of the Pending Patent Examination for Application No. 94102584, dated Nov. 16, 2006.

* cited by examiner

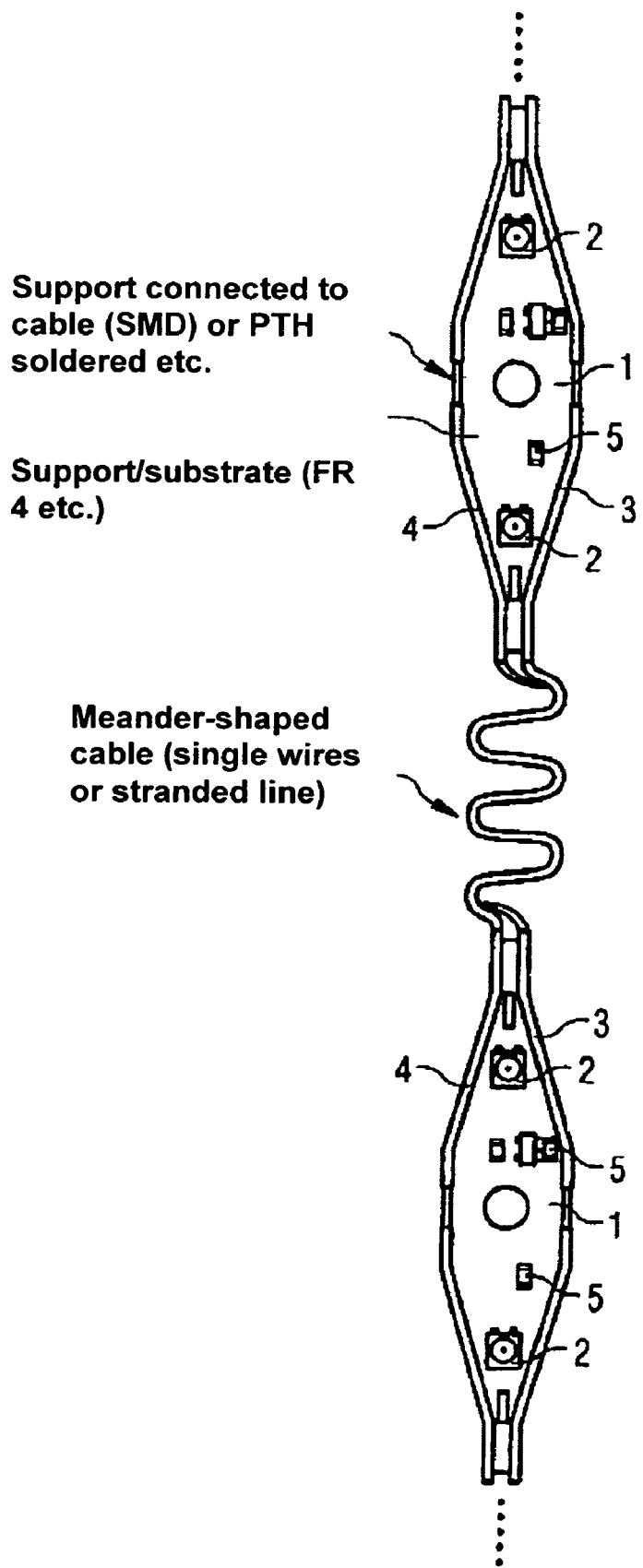

DEFORMABLE ILLUMINATION MODULE

CROSS-REFERENCE TO RELATED APPLICATIONS

This application is the National Stage of International Application No. PCT/DE2005/000143, filed on Jan. 31, 2005, which claims the priority to German Patent Application Serial No. 10 2004004777.4, filed on Jan. 30, 2004. The contents of both applications is hereby incorporated by reference in their entireties.

FIELD OF THE INVENTION

The invention relates to a deformable illumination module with a plurality of circuit boards that have at least one optical emitter arranged thereon, respectively, and that are connected to form a chain via electrical power supply wires. The invention relates in particular to illumination modules for backlighting light-permeable materials such as e.g. acryl in luminous letters.

BACKGROUND OF THE INVENTION

Known illumination modules of this kind, such as e.g. the Tetra® LED system by GELCore or the LED hose by Hansen-neon, do not allow for changing the distances from one light-emitting diode component part to another light-emitting diode component part; they are therefore not scalable in terms of their luminance and, depending on the radiation characteristics with regard to a luminance that is as homogenous as possible, only usable for a very limited magnitude range of luminous letters. Moreover, the maximum length of these illumination modules is very limited.

SUMMARY OF THE INVENTION

It is the object of the present invention to provide an illumination module of the kind as set forth in the introduction that allows for easy varying of the luminance whereby longer chains are possible than to date.

A plurality of circuit boards is provided for an illumination module according to the invention, and arranged on the circuit boards is respectively at least one optical emitter, in particular a light-emitting diode component part, and the circuit boards are connected via two massive electrical power supply wires into a chain. The electrical power supply wires run without interruption across all circuit boards of the chain. The circuit boards of the chain are connected in parallel with regard to each other by way of these power supply wires.

Covered by the term "without interruption" are all configurations that have the power supply wires severed on the circuit board but that are continually electrically connected on the circuit board without considerable reduction of the cross-section.

Aside from the at least one optical emitter, it is possible to arrange on each circuit board additionally at least one further electronic component that is electrically connected to the optical emitter.

A preferred embodiment provides that for the purpose of reinforcing the connection between two respective circuit boards the electrical power supply wires are connected into a bundle between the circuit boards, for example by crimping.

In a special embodiment the circuit boards are grouped into a plurality of circuit board pairs and the optical emitters of each circuit board pair are connected by way of a connecting wire between the two circuit boards.

Light-emitting diode component parts are particularly preferred optical emitters.

The power supply wires between respectively two circuit boards run preferably in a meanderlike fashion. This allows, on the one hand, for varying the distance between two circuit boards and, on the other hand, the bending radius of the chain can be changed easily.

It is particularly preferred for the circuit boards to be tapered in the direction of their ends that are pointing toward each other and for the power supply wires to run together, starting from a widened middle part, along the edges of the circuit boards. The circuit boards are preferably configured in rhomboidal fashion or in the fashion of a flat-pressed hexagon or octagon having their long axes arranged along the main direction of extension of the chain.

Usable as circuit boards are both printed circuit boards (PCB's) as well as metallic lead frames that have the optical emitters and, if need be, the associated electronic component parts arranged thereon. In addition, it is possible to manufacture circuit boards by means of MID technology, including e.g. hot pressing.

A special advantage of the illumination module according to the invention lies in the fact that, without having to change production, it can easily be adjusted for special customer wishes. The meandering form of the power supply cable bundle between the circuit boards allows for extensive variations of the distance between the circuit boards and thereby also for variation of the length of one and the same illumination module.

An illumination module according to the invention can advantageously be manufactured easily via a reel-to-reel process whereby power supply lines that are available in "infinite" form are stripped at certain intervals, and the circuit boards are contact connected at these locations to the otherwise continuous power supply lines and joined to the latter.

In a particularly preferred embodiment the power supply lines run only on the front side of the circuit boards which is also where the optical emitters are located. The circuit boards can then advantageously feature a flat back side thereby allowing, for example, for the technically simple and direct fastening by way of a screw through a hole that is provided for this purpose or by way of double-sided adhesive tape.

Further advantages, improvements and advantageous embodiments become clear based on the exemplary embodiment that is explained in conjunction with the FIGURE.

BRIEF DESCRIPTION OF DRAWINGS

The FIGURE shows a schematic depiction of a top view of the embodiment.

The FIGURE is, as a matter of principle, not to be understood as true to scale. Also, individual component parts are, as a matter of principle, not depicted as representing their actual size-specific dimensions relative to each other.

DETAILED DESCRIPTION OF THE PREFERRED EMBODIMENTS

The exemplary embodiment features a plurality of circuit boards 1. Arranged on said circuit boards 1 are two light-emitting diode component parts 2, respectively, as optical emitters which are connected by way of two electrical power supply wires 3, 4 into a chain. The electrical power supply wires 3, 4 are guided across all circuit boards 1 without interruption creating a parallel connection of the circuit boards 1 of the chain.

Aside from the light-emitting diode component parts 2, the circuit boards 1 have arranged on them further electronic component parts 5, respectively, that are electrically connected to the light-emitting diode components 2.

Electrical power supply wires 3, 4 are combined into bundles, respectively, and crimped to reinforce the connection between two respective circuit boards 1. In the alternative, it is also possible to use a ribbon cable that is unpicked in the area of the circuit boards.

In an embodiment in which the light-emitting diode component parts of two circuit boards that are adjacent to each other, respectively, are connected with one another, with the connection being achieved by way of a further connecting wire between the two circuit boards.

The power supply wires 3, 4 between two given circuit boards 1 run in a meanderlike fashion.

In the direction of the extension of the chain, circuit boards 1 have the shape of an elongated octagon, and the power supply wires 3, 4 run together along the edges of the circuit boards, starting at the widened middle part. In particular, they do not have back-side contacts which means that, during the installation of an illumination module, it is not necessary to take special steps to prevent, for example, a short circuit.

The circuit boards have e.g. a flat back side whereby, for example, direct fastening by way of a screw through a hole provided for that purpose or by way of double-sided adhesive tape is possible.

The illumination module can advantageously be manufactured by way of a reel-to-reel process whereby power supply lines that are available in "infinite" form are stripped at certain intervals. At these stripped locations circuit boards 1 are contact connected to the otherwise continuous power supply lines and joined to the latter.

The illumination module can optionally have secondary optics for beam-forming, for example in the form of detachably (e.g. via a plug-and-socket device or a clamping connection) or non-detachably (e.g. using glue) fastened collecting or diverging lenses and/or diffractive optics (not shown in the FIGURE). This allows for adjusting the luminance and/or the homogeneity of the luminance of the illumination module by changing the radiation characteristics of the light-emitting diode components 2.

The description of the invention by way of the embodiment shall naturally not be seen as a limitation of the invention to this embodiment alone. The characteristics of the invention that are disclosed in the present description, in the drawing and in the claims can have essential significance either individually or in any combination for the implementation of the invention.

The invention claimed is:

1. A deformable illumination module, comprising:
   a plurality of circuit boards that have at least one optical emitter arranged thereon, respectively, and that are connected into a chain by way of two electrical power supply wires,
   wherein the electrical power supply wires are configured to run without interruption across all circuit boards of the chain thereby creating a parallel connection of the circuit boards of the chain; and
   wherein each of the electrical power supply wires is a continuous wire that forms a single electrical contact to each of the plurality of circuit boards.

2. Illumination module as claimed in claim 1 wherein at least one further electronic component is arranged on a circuit board, in addition to the at least one optical emitter, and electrically connected to the optical emitter.

3. Illumination module as claimed in claim 1 wherein the electrical power supply wires are connected to form a bundle between two circuit boards, respectively, in order to reinforce the connection between two circuit boards.

4. Illumination module as claimed in claim 1 wherein the circuit boards are grouped into a plurality of circuit board pairs and wherein the optical emitters, respectively, of a circuit board pair are connected by way of a connecting wire between the two circuit boards.

5. Illumination module as claimed in claim 1 wherein the optical emitters are light-emitting diode component parts.

6. Illumination module as claimed in claim 1 wherein the power supply wires between two respective circuit boards run in a meanderlike fashion.

7. Illumination module as claimed in claim 1 wherein the circuit boards are tapered in the direction of their ends that are pointed toward each other and wherein the power supply wires run together, starting from the widened middle part, along the edges of the circuit boards.

8. Illumination module as claimed in claim 7 wherein the circuit boards are configured in rhomboidal fashion or in the fashion of a flat-pressed hexagon or octagon having their long axes arranged along the main direction of extension of the chain.

9. Illumination module as claimed in claim 1 wherein both a bending radius between two circuit boards as well as a distance between the two circuit boards can be varied.

10. A deformable illumination module, comprising:
    a plurality of circuit boards that have at least one optical emitter arranged thereon, respectively, and that are connected into a chain by way of two electrical power supply wires,
    wherein the electrical power supply wires are configured to run without interruption across all circuit boards of the chain; and
    wherein the two electrical power supply wires run along opposite edges of each of the circuit boards.

11. The illumination module of claim 10, further comprising at least one additional electronic component arranged on each of the circuit boards in addition to the at least one optical emitter, wherein the at least one electronic component on each of the circuit boards is electrically connected to the at least one optical emitter.

12. The illumination module of claim 10, wherein the electrical power supply wires are connected to form a bundle between two circuit boards, respectively, in order to reinforce the connection between two circuit boards.

13. The illumination module of claim 10, wherein the circuit boards are grouped into a plurality of circuit board pairs and wherein the optical emitters, respectively, of a circuit board pair are connected by way of a connecting wire between the two circuit boards.

14. The illumination module of claim 10, wherein the optical emitters are light-emitting diode component parts.

15. The illumination module of claim 10, wherein the power supply wires between two respective circuit boards run in a meanderlike fashion.

16. The illumination module of claim 10, wherein the circuit boards are tapered in the direction of their ends that are pointed toward each other and wherein the power supply wires run together, starting from the widened middle part, along the edges of the circuit boards.

17. The illumination module of claim 16, wherein the circuit boards are configured in rhomboidal fashion or in the fashion of a flat-pressed hexagon or octagon having their long axes arranged along the main direction of extension of the chain.

18. The illumination module of claim 10, wherein both a bending radius between two circuit boards as well as a distance between the two circuit boards can be varied.

* * * * *